United States Patent [19]

Okamura et al.

[11] Patent Number: 5,439,715

[45] Date of Patent: Aug. 8, 1995

[54] PROCESS AND APPARATUS FOR MICROWAVE PLASMA CHEMICAL VAPOR DEPOSITION

[75] Inventors: Ryuji Okamura, Shiga; Hirokazu Otoshi; Tetsuya Takei, both of Nagahama, all of Japan

[73] Assignee: Canon Kabushiki Kaisha, Tokyo, Japan

[21] Appl. No.: 165,868

[22] Filed: Dec. 14, 1993

Related U.S. Application Data

[63] Continuation of Ser. No. 635,975, Dec. 31, 1990, abandoned, which is a continuation of Ser. No. 526,536, May 21, 1990, Pat. No. 5,030,476, which is a continuation of Ser. No. 382,218, Jul. 20, 1989, abandoned.

[30] Foreign Application Priority Data

Jul. 22, 1988 [JP] Japan ................................ 63-181564
Jun. 16, 1989 [JP] Japan ................................ 1-152228

[51] Int. Cl.$^6$ .......................... B05D 3/06; C23C 16/50
[52] U.S. Cl. ...................................... 427/575; 427/578; 118/723 MW; 118/723 MP; 118/724; 118/728
[58] Field of Search ............................ 427/575, 578; 118/723 MW, 723 MP, 724, 728

[56] References Cited

U.S. PATENT DOCUMENTS

| | | | |
|---|---|---|---|
| 4,421,592 | 12/1983 | Shuskus et al. | 427/569 |
| 4,785,763 | 11/1988 | Saitoh | 118/723 |
| 4,897,284 | 1/1990 | Arai et al. | 427/39 |

FOREIGN PATENT DOCUMENTS

| | | |
|---|---|---|
| 62-054080 | 3/1987 | Japan . |
| 62-054081 | 3/1987 | Japan . |
| 63-007371 | 1/1988 | Japan . |
| 086371 | 9/1981 | U.S.S.R. . |

*Primary Examiner*—Roy V. King
*Attorney, Agent, or Firm*—Fitzpatrick, Cella, Harper & Scinto

[57] ABSTRACT

A process for forming a functional deposited film which is adapted for use in an apparatus which comprises a substantially enclosed reaction chamber, a plurality of cylindrical substrates arranged to surround a discharge space and a microwave introduction means provided at least at one end of each cylindrical substrate and wherein microwave energy is introduced so that a glow discharge plasma containing reactant gases derived from starting gases is formed in the discharge space thereby forming a deposited film on each cylindrical substrate is described. The process is characterized in that a temperature control means is provided in the inside of each of said plurality of cylindrical substrates and simultaneous with the introduction of a thermally conductive gas, the thermally conductive gas is exhausted from the one end of each cylindrical substrate in the vicinity of the microwave introduction means. The process enables the deposited film of good quality to be formed stably at high speed and the deposited film is useful as an element member for semiconductive devices, photosensitive devices for electrophotography, photovoltaic devices, other electronic elements and optical elements.

3 Claims, 9 Drawing Sheets

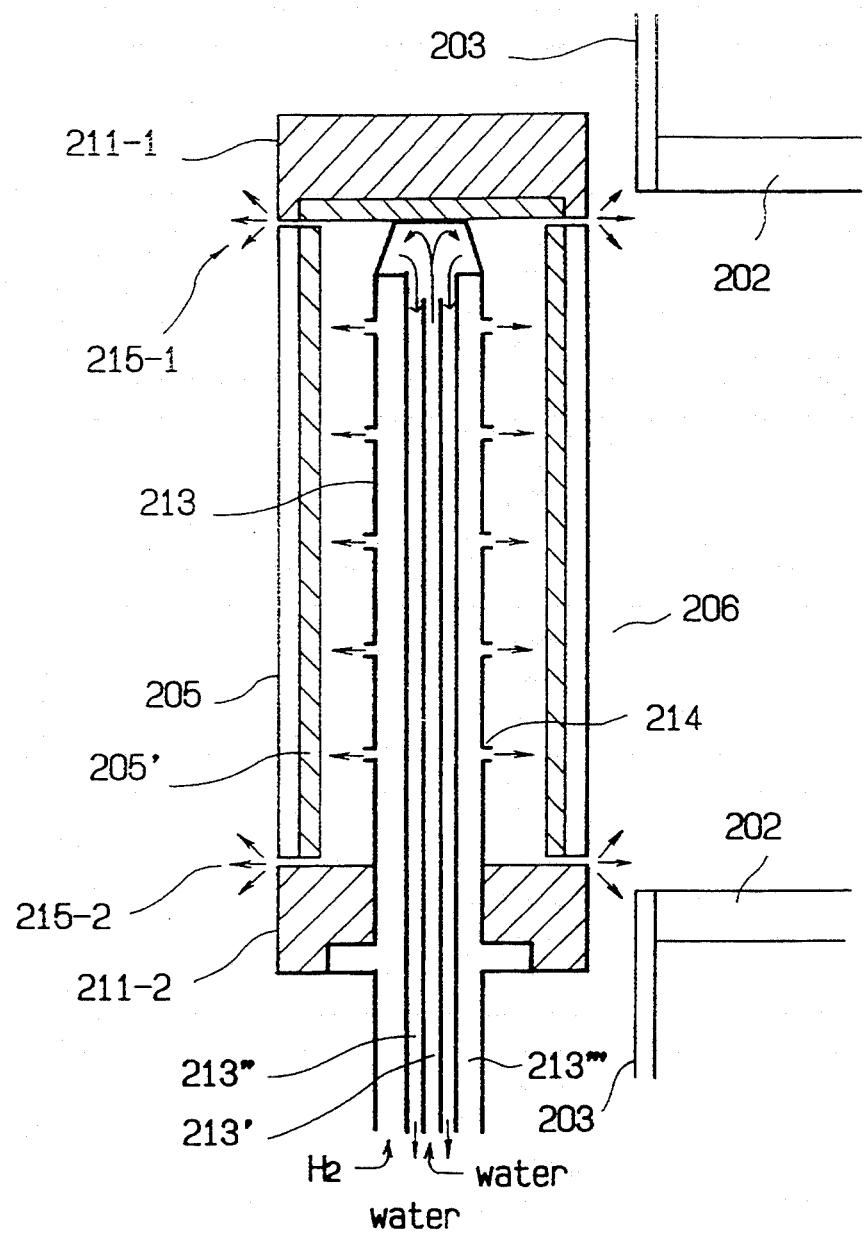

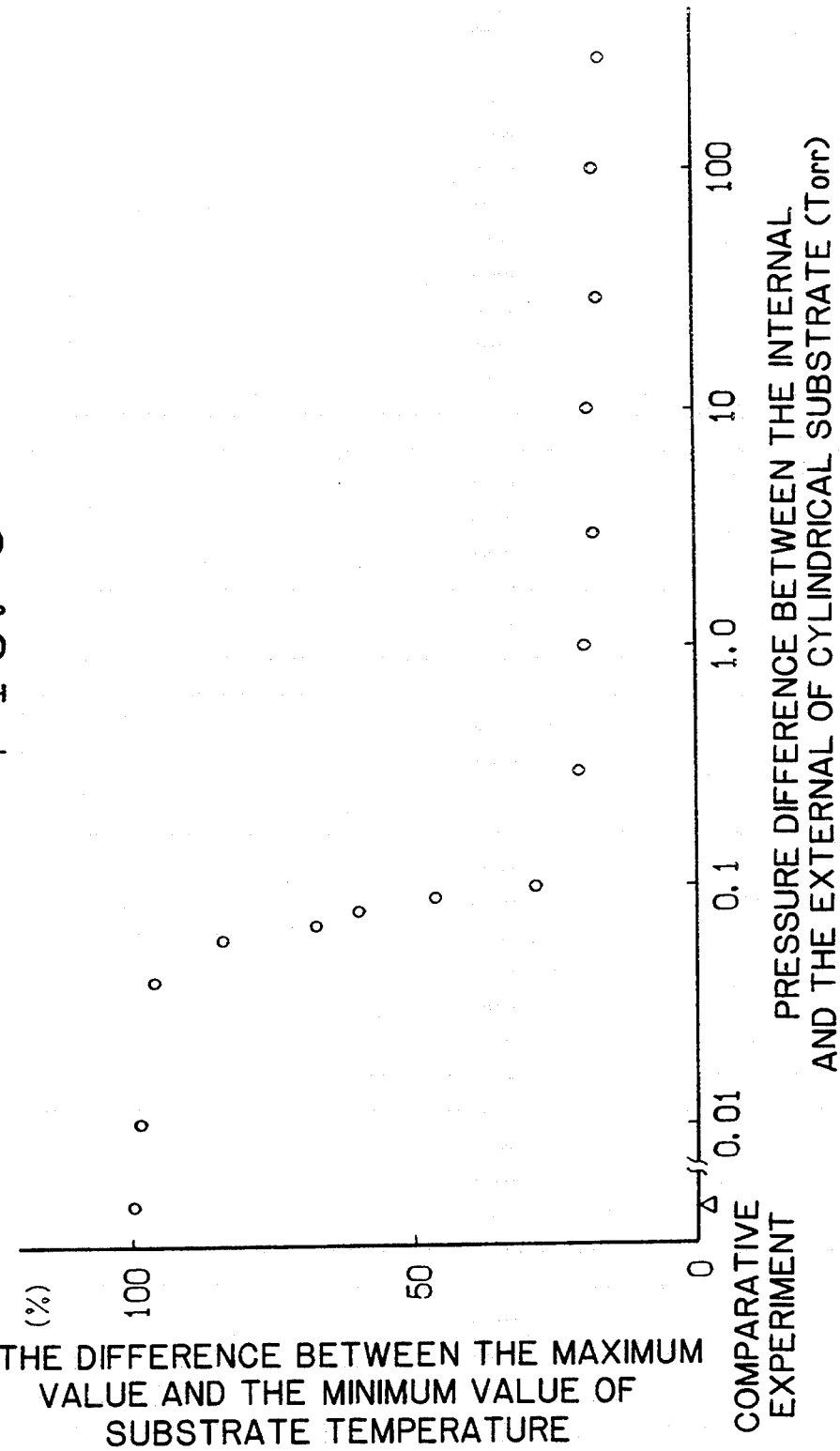

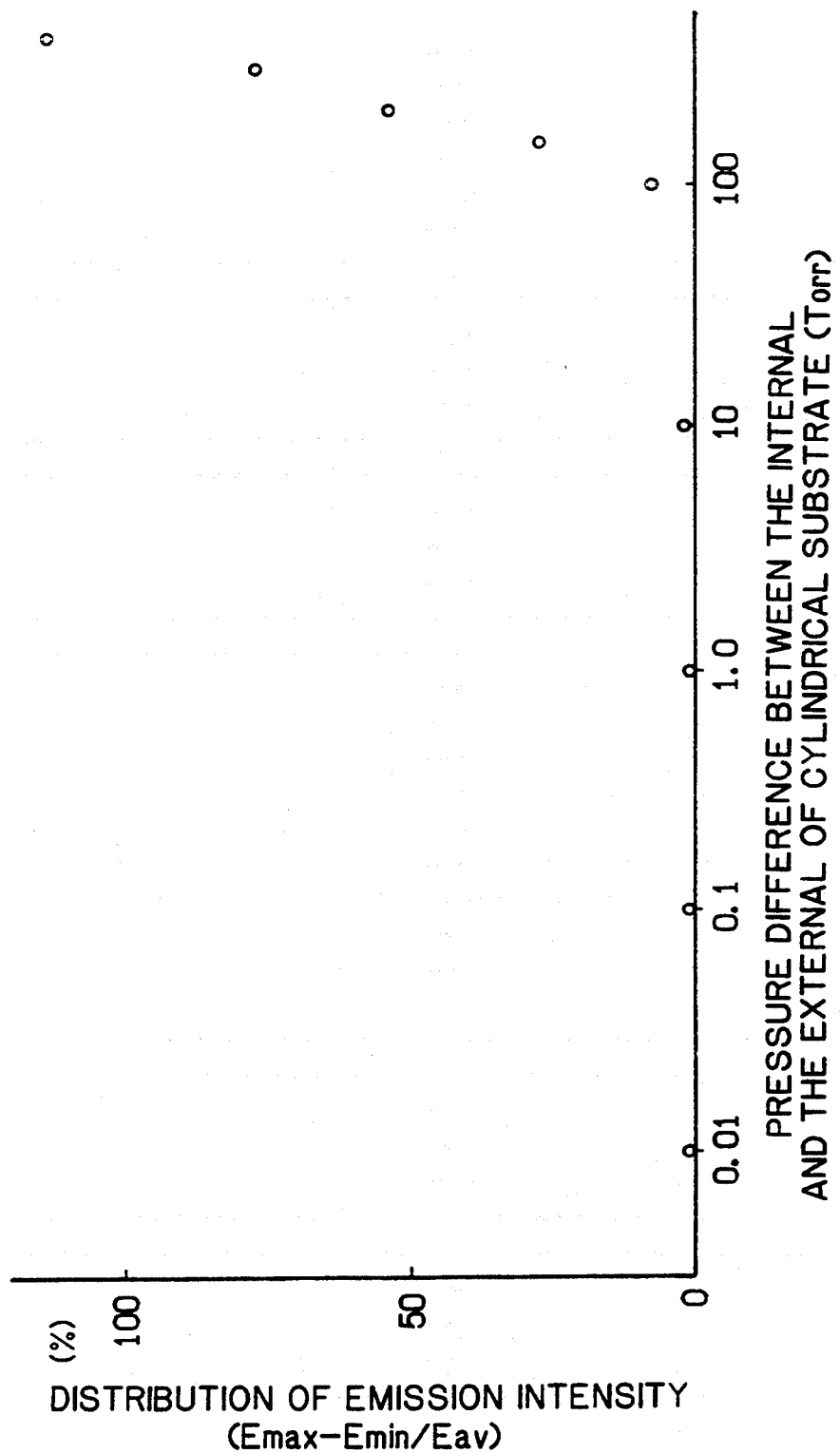

PROCESS AND APPARATUS FOR MICROWAVE PLASMA CHEMICAL VAPOR DEPOSITION

This application is a continuation of application Ser. No. 07/635,975 filed Dec. 31, 1990, now abandoned, which is a continuation of application Ser. No. 07/526,536 filed May 21, 1990, now U.S. Pat. No. 5,030,476, which is a continuation of application Ser. No. 06/382,218 filed Jul. 20, 1989, now abandoned.

FIELD OF THE INVENTION

The present invention relates to an improved process for stably forming a functional deposited film, which is usable as an element member in semiconductor devices, electrophotographic photosensitive devices, photovoltaic elements, other electronic elements, optical elements and the like, at high deposition rate by microwave plasma chemical vapor deposition process (hereinafter referred to as "MW-PCVD process").

More particularly, the present invention relates to an improved process for stably forming a desirable functional film on a cylindrical substrate at high deposition rate by MW-PCVD process wherein the difference between the pressure of a discharge space in which plasma is formed and the pressure of the inside of said cylindrical substrate is maintained at a prescribed level and to an apparatus suitable for practicing said process.

BACKGROUND OF THE INVENTION

Heretofore, there have been proposed a number of amorphous semiconductor films such as an amorphous deposited film composed of an amorphous silicon material compensated with hydrogen atoms (H) or/and halogen atoms (X) such as fluorine or chlorine atoms [hereinafter referred to as "A-Si(H,X)"]. Some of such films have been put to practical use as an element member in semiconductor devices, electrophotographic photosensitive devices, image input line sensors, image pickup devices, photovoltaic devices, other various electronic and optical devices. Several of them have now been put into practice.

It is known that such semiconductor deposited films may be obtained by means of a DC glow discharge decomposition process, a high frequency glow discharge decomposition process or a microwave glow discharge decomposition process, that is, a process of forming a deposited film on a substrate of glass, quartz, heat-resistant resin, stainless steel or aluminum by decomposing a film-forming raw material gas with a glow discharge using a DC energy, a high frequency energy, or a microwave energy. In recent years, the public attention has been focused on the glow discharge decomposition method using a microwave energy (that is, MW-PCVD method) at industrial level since the MW-PCVD method is remarkably advantageous over other methods with the points that film deposition rate is high and utilization efficiency of a film-forming raw material gas is high.

Along with this, there have been proposed various MW-PCVD apparatuses for practicing said MW-PCVD method.

In Japanese Laid-open Patent Application No. 60-186849, there is disclosed a MW-PCVD apparatus utilizing the above-mentioned advantages. This apparatus includes a discharge space wherein a plurality of cylindrical substrates are arranged to surround a microwave energy-introducing means, thereby highly enhancing the gas utilization efficiency.

In addition, in Japanese Laid-open Patent Application No. 61-283116 (U.S. Pat. No. 4,619,729, issued Oct. 28, 1986), there is disclosed an improved microwave system for fabricating a semiconductive member. This method lies in improving characteristics of a deposited film wherein there are provided electrodes in a plasma space for controlling the potential of plasma as formed, and a desired voltage is applied between the electrodes to deposit a film while controlling ion impact of the deposition species.

Now, a typical example of the foregoing MW-PCVD apparatus has such constitution as shown FIGS. 6(A) and 6(B). FIG. 6(A) is a schematic explanatory view illustrating the constitution of the known MW-PCVD apparatus, and FIG. 6(B) is a schematic cross section view of the apparatus shown in FIG. 6(A) by X—X line.

In FIGS. 6(A) and 6(B), reference numeral 601 indicates a film-forming chamber having a vacuum tight structure. Reference numeral 602 indicates a microwave introducing window made of a dielectric material capable of efficiently transmitting microwave into the film-forming chamber. Said material of which the microwave introducing window is made is quartz glass, alumina ceramics or the like. Reference numeral 603 designates a waveguide connected to a microwave power source (not shown) through a stab tuner (not shown) and an isolator (not shown). Reference numeral 604 indicates an exhaust pipe which is provided with the film-forming chamber 601, and it is connected through an exhaust valve (not shown) to an exhaust device (not shown). Reference numeral 605 indicates cylindrical substrates on each of which a deposited film is to be formed, and reference numeral 606 indicates a discharge space surrounded by the substrates 605.

The formation of a deposited film in this apparatus is carried out in the following manner.

The film-forming chamber (601) is evacuated through the exhaust pipe (604) by means of the exhaust device (vacuum pump) (not shown) to such an extent that the pressure in the film-forming chamber is controlled to be $1 \times 10^{-7}$ Torr or below. Subsequently, each of the substrates (605) is heated to and maintained at a temperature necessary for film deposition by the use of external heaters (612). Film-forming raw material gases are introduced into the film-forming chamber (601) through a gas feed means (not shown), for example, in the case where an amorphous silicon deposited film is formed, film-forming raw material gases such as silane gas and hydrogen gas are introduced into the film-forming chamber. Simultaneously, the microwave power source is switched on to generate a microwave having a frequency of not less than 500 MHZ, preferably 2.45 MHz, followed by transmission through the waveguide (603) and the microwave introducing window (602) into the film-forming chamber (601). In this way, the film-forming raw material gases are excited by means of the microwave energy in the discharge space (606) surrounded by the cylindrical substrates (605) and they are decomposed, thereby causing the formation of a deposited film on each of the substrates. During this process, the substrates (605) are rotated. As a result, there is formed a deposited film over the entire surface of each of the substrates.

According to the above film-forming process, a certain deposition rate enables one to obtain a deposited film having practically appreciable characteristics and uniformity. However, if the deposition rate becomes higher, it is difficult to invariably and stably obtain a deposited film with a uniform film quality having satisfactory optical and electric characteristics in high yield particularly in the fabrication of a deposited film of a large area as required, for example, for an electrophotographic photosensitive member. This is a serious problem to solve.

More particularly, in order to form a deposited film on a substrate of large area at a high deposition rate while keeping a high utilization efficiency of a film-forming raw material gas, it is necessary to introduce a great quantity of microwave energy into the film-forming chamber. For this purpose, there is used a waveguide having a dielectric window excelling in microwave transmission. In this case, the microwave energy density in the vicinity of the microwave introducing means in the film-forming chamber becomes far greater than those in other portions. This entails irregularities in the thickness and the quality between a deposited film formed on the part of the surface of a substrate located near the microwave introducing means and a deposited film on the remaining part thereof, with a lowering of the characteristics of the deposited film. Moreover, a film which is formed as relatively thick in the vicinity of the microwave introducing means will often peel off and the thus removed films will often deposit on a film formed on another part of the substrate, thus causing defects for the film obtained.

In order to eliminate the above problems, there has been made a proposal by Japanese Patent Publication No. 61-53432 wherein an auxiliary substrate is provided with the substrate in the vicinity of the microwave introducing means. The method according to this proposal is effective in other PCVD processes than MW-PCVD process. That is, in the case of the MW-PCVD process using microwave plasma wherein microwave is introduced through a waveguide, film separation from the auxiliary substrate cannot be prevented completely, and therefore, the method according to said proposal is not sufficient to eliminate the foregoing problems. In addition, in the case of the film-forming process to be practiced in the apparatus shown in FIGS. 6(A) and 6(B), the microwave energy density is relatively high in the vicinity of the microwave introducing means (602, 603), and because of this, there will be deposited a film also on the surface of the microwave introducing window in the film-forming chamber with a thickness being several times thicker than that of a film deposited on the surface of each of the cylindrical substrates. And the film thus deposited on the surface of the microwave introducing window results in peeling off in pieces which contaminate in a film to be deposited on the surface of each of the cylindrical substrates. In this respect, it is difficult for the resulting deposited film according to this method to be completely free from the problems relating to defects.

Further, the apparatus shown in FIGS. 6(A) and 6(B) is accompanied with other problems with respect to the thickness and the uniformity in characteristics for a deposited film to be formed. That is, in this apparatus, film-forming raw material gases are decomposed with the action of microwave energy to cause the formation of a deposited film. The unreacted gases and the gases formed as a result of the reaction are exhausted through spaces of a rectangular form established between the cylindrical substrates (605) to outside the discharge space (606). At that time, part of those gases is exhausted from the spaces between the end of each cylindrical substrate (605) including the auxiliary substrate (611) and the waveguide (603). The gas flow which caused in this case makes a flow of gas along the direction of the generating line on the surface of each cylindrical substrate (605), thus causing unevenness in the thickness and characteristics for a film to be deposited.

One of the reasons why a deposited film having good characteristics cannot be obtained particularly at high deposition rate in the conventional film-forming process is that a difficulty is involved in the temperature control of a substrate during the plasma discharge. That is, in order to heighten the deposition rate, it is necessary to raise the flow rate of a film-forming raw material gas and the discharging microwave power. For instance, in order for the deposition rate to be 50 Å/sec. or more, a discharging microwave power of 1 KW or more is necessitated. And when the discharge is continued with such high discharging microwave power, the substrate temperature accordingly continues to increase because of heat generated by the microwave applied. In view of this, it necessitates to properly control the substrate temperature during the film formation. For properly controlling the substrate temperature, there are known several manners: a manner wherein a heater installed in a substrate holder is turned off simultaneously with commencement of the plasma discharge, a manner wherein a heater installed in a substrate holder is provided with a cooling pipe and is used not only as a heating means but also as a cooling means, and a manner wherein a vacuum container serving only to heat a substrate is provided and after the substrate being heated therein, it is vacuum-transferred to a film-forming chamber. However, satisfactory effects cannot be obtained by any of these manners.

By the way, it is well known that the characteristics of a deposited film prepared according to the conventional MW-PCVD process are greatly influenced by the substrate temperature during the deposition, e.g. when a deposited film comprised of A-Si(H,X) for photosensitive drum is formed during which the substrate temperature is over a certain level, hydrogen atoms in the deposited film are dissociated and this makes the resulting photosensitive drum to be poor in the charging properties in an electrophotographic image-forming process.

The present inventors have found that there are still problems even in the case of the MW-PCVD process wherein ion impacts of deposition species are controlled in order to improve the characteristics of a deposited film using such MW-PCVD apparatus as shown in FIGS. 5(A) and 5(B) which has been established by the present inventors, wherein a bias electrode is provided in the discharge space in combined use with microwave plasma discharge, and the electrode is applied with a desired DC voltage. The MW-PCVD apparatus shown in FIGS. 5(A) and 5(B) is of the same constitution as the conventional MW-PCVD apparatus shown in FIG. 6(A) and FIG. 6(B) except that there is provided a bias electrode 511. That is, in addition to the microwave plasma, the energy of ion impacts on the substrate after acceleration of the ions with an electric field contributes to heat the substrate. As a result, the substrate eventually becomes very high in temperature as the discharge time is prolonged, and because of this, the resulting deposited film is apt to become ununiform in the characteristics. This process includes another factor to make the resulting deposited film to be lacking in the uniformity of the characteristics because of easy occurrence of ununiformity in ion impacts. That is, the microwave introducing means is provided near the end portion of the cylindrical substrate in the apparatus in which this process is to be practiced as described above and because of this, the ion density in the vicinity of the microwave introducing means is inevitably increased. This causes ununiformity in the ion impacts on the surfaces between the region in the vicinity of the microwave introducing means and the other region, causing the characteristics of the resulting deposited film to be ununiform. The ununiformity of the ion impacts becomes more pronounced with increasing microwave discharging power. As above described, the current technical situation in the formation of a functional deposited film by means of MW-PCVD process is that it is difficult to stably form a desirable functional deposited film of large area having a uniform thickness and excelling in evenness for the characteristics as desired.

SUMMARY OF THE INVENTION

An object of the present invention is to provide an improved process for forming a functional deposited film according to MW-PCVD technique, which overcomes the foregoing problems involved in the conventional MW-PCVD process and makes one possible to stably form a desired functional deposited film of large area at a high deposition rate, which is effectively usable as an element member for semiconductor devices, electrophotographic photosensitive devices, photovoltaic devices, other electronic and optical devices.

Another object of the present invention is to provide an improved MW-PCVD process for forming a A-Si(H,X) deposited film of large area having a uniform thickness and excelling in uniformity for the characteristics as desired.

A further object of the present invention is to provide an improved MW-PCVD apparatus which is suitable for practicing the foregoing improved MW-PCVD process for forming a functional deposited film.

The present invention has been accomplished as a result of extensive studies by the present inventors in order to solve the foregoing problems involved in the known MW-PCVD process for forming a deposited film.

The present invention is to attain the above objects. According to the present invention, there are provided an improved MW-PCVD process for forming a functional deposited film and an apparatus suitable for practicing said improved MW- PCVD process.

The improved MW-PCVD process to be provided according to the present invention is: a microwave plasma chemical vapor deposition process for the formation of a functional deposited film on a plurality of cylindrical substrates each having an auxiliary substrate by means of a microwave plasma chemical vapor deposition to be conducted in a substantially enclosed cylindrical film-forming chamber, said film-forming chamber being cylindrical and comprising a circumferential wall having an end portion thereof hermetically provided with a microwave introducing window to which a waveguide extending from a microwave power source is connected, said film-forming chamber having a discharge space and a plurality of rotatable cylindrical substrate holders therein, each of said substrate holders being capable of having one of said cylindrical substrates positioned thereon, said substrate holders being concentrically arranged in said film-forming chamber so as to circumscribe said discharge space, said film-forming chamber being provided with means for supplying a film-forming raw material gas into said discharge space and means for evacuating said film-forming chamber, wherein a functional deposited film is formed on each of said cylindrical substrates by microwave glow discharge in film-forming raw material gas to generate plasma causing the formation of said functional deposited film on each of said cylindrical substrates while rotating said cylindrical substrates, characterized in that each of the cylindrical substrates is maintained at a desired temperature by using a thermally conductive gas such as hydrogen gas or an inert gas, cooling said thermally conductive gas with a cooling liquid medium such as water, and passing the cooled thermally conductive gas through the inside space of the cylindrical substrate holder on which said cylindrical substrate being positioned and through (a) a joint allowance between the upper auxiliary substrate and the cylindrical substrate holder and (b) a joint allowance between the lower auxiliary substrate and the cylindrical substrate holder into the film-forming chamber.

The apparatus to be provided according to the present invention which is suitable for practicing the above microwave plasma chemical vapor deposition process is: an apparatus for the formation of a functional deposited film on a plurality of cylindrical substrates each having upper and lower auxiliary substrates by means of microwave plasma chemical vapor deposition, said apparatus having a substantially enclosed cylindrical film-forming chamber with a center longitudinal axis and comprising a circumferential wall having an end portion thereof provided with a microwave introducing window to which a waveguide extending from a microwave power source is connected, said cylindrical film-forming chamber having a plasma generation space and a plurality of rotatable cylindrical substrate holders therein, each of said substrate holders capable of having one of said cylindrical substrates positioned thereon, said rotatable cylindrical substrate holders being concentrically arranged in said cylindrical film-forming chamber substantially parallel and equidistant from said center longitudinal axis of said deposition chamber, said cylindrical film-forming chamber being provided with means for supplying a film-forming raw material gas into said plasma generation space and means for evacuating said cylindrical film-forming chamber, characterized in that the inside cylindrical space of each of said cylindrical substrate holders which is formed by the circumferential wall of the cylindrical substrate holder, the inner wall of the upper auxiliary substrate and the inner wall of the lower auxiliary substrate being provided with a temperature controlling system installed in the middle leaving a circular space between the inner wall of the cylindrical substrate holder and said temperature controlling system to allow passage of a thermally conductive gas such as hydrogen gas or an inert gas supplied from said temperature controlling system which serves to cool the cylindrical substrate from its rear side, said thermally conductive gas supplied from said temperature controlling system into said circular space passing through (a) a joint allowance between the upper auxiliary substrate and the cylindrical substrate and (b) a joint allowance between the lower auxiliary substrate and the cylindrical substrate into the cylindrical film-forming chamber, said temperature controlling system comprising a concentric triplicate conduit having a cylindrical conduit positioned in the middle which serves to supply a cooling liquid medium such as water, a first circular conduit next -to said cylindrical conduit which serves to recycle said cooling liquid medium and a second circular conduit next to said first circular conduit having a plurality of gas liberation holes which serves to supply said thermally conductive gas into said circular space through said plurality of gas liberation holes while cooling said thermally conductive gas by way of heat exchange with said cooling liquid medium passing through said first circular conduit.

These and other objects, as well as the features of this invention will become apparent by the following descriptions of preferred embodiments according to this invention while referring to the accompanying drawings.

BRIEF DESCRIPTION OF THE DRAWINGS

FIG. 2 is an schematic illustrative view showing a temperature controlling system installed in the cylindrical substrate holder of the apparatus shown in FIGS. 1(A) and 1(B).

FIG. 3 is a graph showing the interrelations between the pressure difference between the inside and outside of cylindrical substrate and the difference in substrate temperature between the maximum and minimum values.

FIG. 4 is a graph showing the interrelations between the pressure different between the inside and outside of cylindrical substrate and the dispersion in luminous intensity.

DETAILED DESCRIPTION OF THE INVENTION

The present inventors have conducted extensive studies for overcoming the foregoing problems on the conventional MW-PCVD processes and attaining the objects as described above, and as a result, have accomplished the present invention.

Figure 1A:
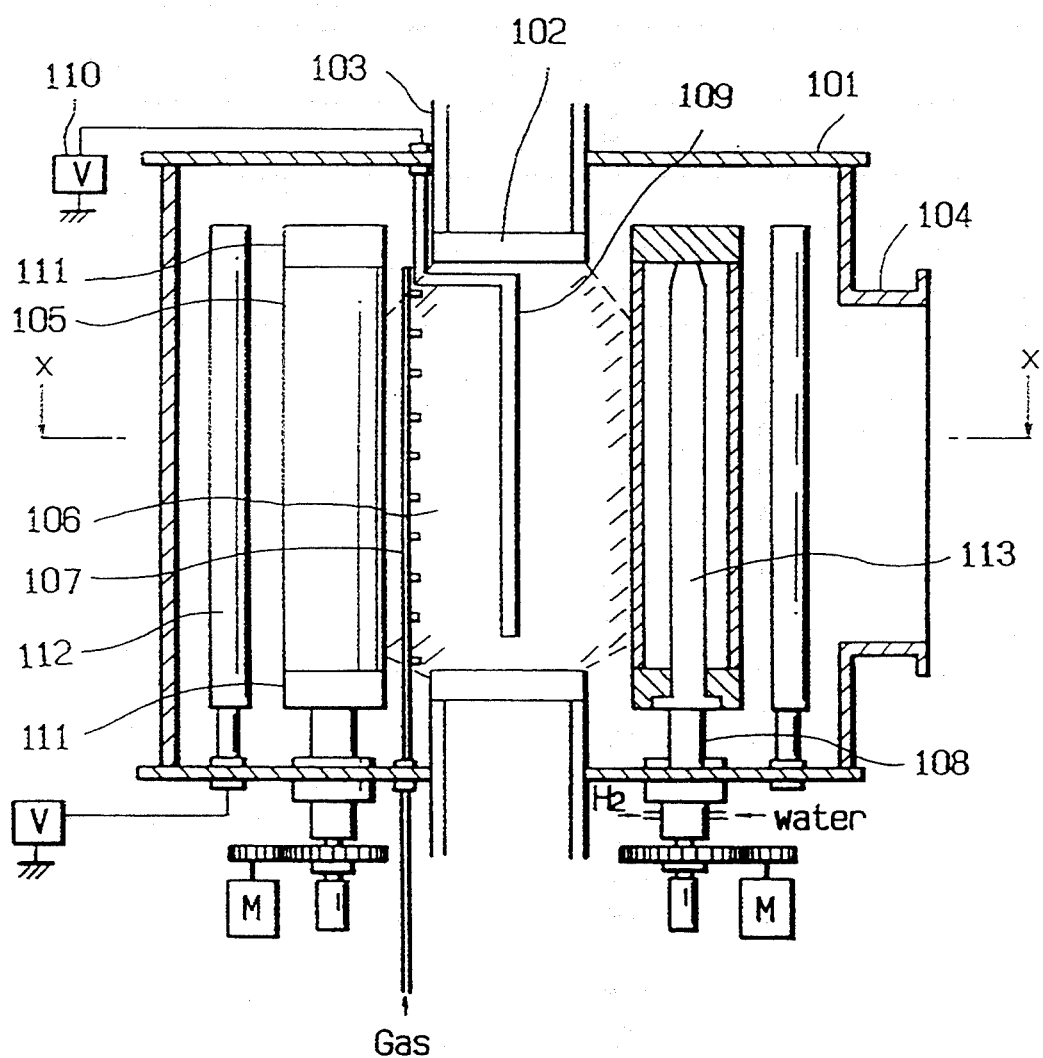
FIG. 1(A) is a schematic side section of a MW-PCVD apparatus adapted for carrying out the improved MW-PCVD process for forming a functional deposited film according to the present invention.
Figure 1B:
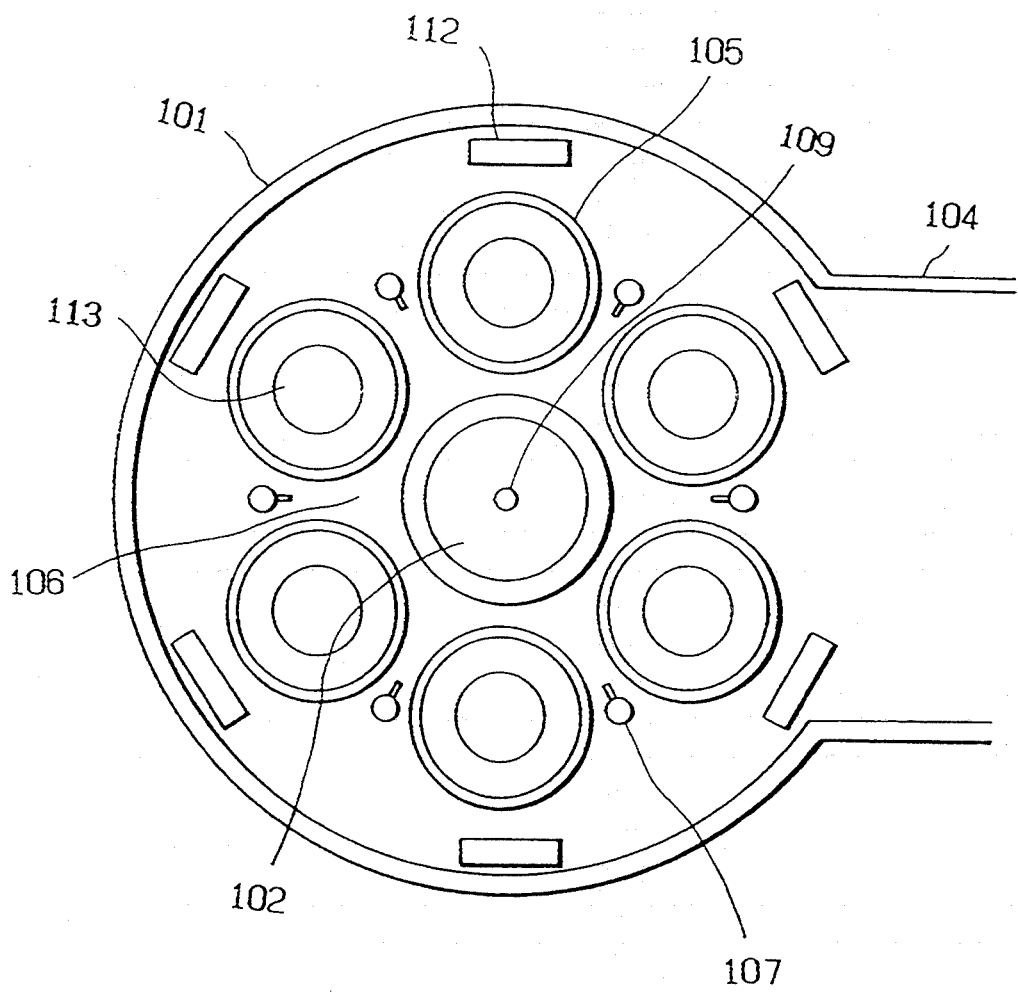
FIG. 1(B) is a schematic plan view, in section, along line X—X of FIG. 1(A).

Explanation is to be made about the constitution of the MW- PCVD apparatus shown in FIGS. 1(A), 1(B) and 2, which is suitable for practicing the film-forming MW-PCVD process according to the present invention.

FIG. 1(A) is a schematic explanatory view of the MW-PCVD apparatus suitable for practicing the MW-PCVD process for forming a functional deposited film according to the present invention. FIG. 1(B) is a schematic plan section view, taken along line X—X of the apparatus in FIG. 1(A). FIG. 2 is a schematic explanatory view of the constitution of a temperature controlling system installed in the apparatus shown in FIG. 1(A).

Referring to FIGS. 1(A) and 1(B), reference numeral 101 stands for a substantially enclosed cylindrical film-forming chamber with a center longitudinal axis which comprises a circumferential wall having two end portions thereof, each of which being provided with a microwave introducing window 102 to which a waveguide 103 extending from a microwave power source (not shown) is connected. Said cylindrical film-forming chamber 101 has a discharge space 106 (plasma generation space in other words) and a plurality of rotatable cylindrical substrate holders therein, each of which being capable of having a cylindrical substrate 105 on which a film is to be deposited, an upper auxiliary substrate 111 (211-1 in FIG. 2) and a lower auxiliary substrate 111 (211-2 in FIG. 2) being properly so arranged thereon as to enclose its inside space.

Each of said plurality of rotatable cylindrical substrate holders is supported by a rotary shaft 108 mechanically connected to a driving motor.

Said plurality of cylindrical substrate holders are concentrically arranged in said cylindrical film-forming chamber 101 substantially parallel and equidistant from said center longitudinal axis. Said cylindrical film-forming chamber 101 is provided with a plurality of longitudinal gas feed pipes 107, each of which being provided with a plurality of gas liberation nozzles capable of effectively supplying a film-forming raw material gas into said discharge space 106. In a preferred embodiment in this respect, a longitudinal gas feed pipe 107 is arranged between every two cylindrical substrates 105 so that said discharge space 106 is circumscribed by said plurality of cylindrical substrates 105 and said plurality of longitudinal gas feed pipes 107. Reference numeral 104 is an exhaust pipe provided with said cylindrical film-forming chamber 101, which is connected through an exhaust valve (not shown) to an exhaust device (not shown). In said cylindrical film-forming chamber 101, there are installed a plurality of heating means 112 capable of adjusting the temperature of each of said cylindrical substrates 105 at an appropriate temperature prior to commencement of microwave discharge for forming a deposited film by applying microwave energy into said discharge space 106. Reference numeral 109 stands for a bias electrode suspended in said discharge space, which is electrically connected to a DC power source 110. This electrode 109 is optional, and it can be used in combination with microwave plasma discharge. In this case, a desired voltage of DC is applied between said electrode 109 and said plurality of cylindrical substrates 105 to thereby cause an electric field which results in controlling ion impacts of active species causing the formation of a deposited film. Numeral reference 113 stands for a temperature controlling system capable of controlling the temperature of a cylindrical substrate 105 during film formation, which is installed in the inside space of each rotatable cylindrical substrate holder having a cylindrical substrate 105 thereon.

The temperature controlling system 113 installed in the inside space of each rotatable cylindrical substrate holder serves to prevent each cylindrical substrate 105 from being heated to undesirably high temperature with the action of microwave as applied and to maintain said substrate at a desired temperature during film formation by cooling said substrate from its rear side with an appropriate thermally conductive gas such as hydrogen gas or an inert gas e.g. He gas, etc. being cooled indirectly with a cooling liquid medium such as water.

The temperature controlling system may take any constitution as long as the above object can be effectively attained.

A preferred embodiment of the temperature controlling system 113 is as shown in FIG. 2.

Referring to FIG. 2, reference numeral 213 stands for a temperature controlling system which is provided in a cylindrical inside space of each rotatable cylindrical substrate holder having a cylindrical substrate 205 thereon, said cylindrical inside space being formed by circumferential wall 205' having a divided wall structure of the cylindrical substrate holder being supported by the foregoing rotary shaft 108 (this situation is not shown), the inner wall of an upper auxiliary substrate 211-1 being disposed with the upper end portion of said circumferential wall 205' while leaving a slight joint allowance 215-1 capable of allowing passage of the foregoing thermally conductive gas, and the inner wall of a lower auxiliary substrate 211-2 being disposed with the lower end portion of said circumferential wall 205' while leaving a slight joint allowance 215-2 capable of allowing passage of the foregoing thermally conductive gas. The divided wall structure of said circumferential wall 205' is vacuum-sealed by the cylindrical substrate 205 disposed thereon.

The temperature controlling system 213 is vertically installed in the middle of the foregoing cylindrical inside space leaving a circular space of proper width between said temperature controlling system and the circumferential wall of the cylindrical substrate holder which allows passage of the foregoing cooled thermally conductive gas supplied from said temperature controlling system into the discharge space 106 through the upper and lower joint allowances 211-1 and 211-2 while cooling the cylindrical substrate 105 from its rear side.

In a preferred embodiment, the temperature controlling system 213 comprises a concentric triplicate cylindrical conduit having a cylindrical conduit 213' positioned in the middle which is extended from a reservoir (not shown) and which serves to supply a cooling liquid medium such as water, a first circular conduit 213" positioned next to said cylindrical conduit which serves to recycle said cooling liquid medium to said reservoir while being cooled through a cooling system (not shown), and a second circular conduit 213'" positioned next to said first circular conduit which has a plurality of gas liberation holes capable of supplying the foregoing thermally conductive gas toward the circumferential wall 205' of the cylindrical substrate holder and which serves to supply the foregoing thermally conductive gas into the foregoing circular space while cooling said gas by way of heat exchange with the foreoging cooling liquid medium passing through said first circular conduit 213".

The cylindrical conduit 213' and the first circular conduit 213" are connected at their upper end portions through a proper recycling space.

As for each of the upper and lower joint allowances 215-1 and 215-2, a specific consideration should be made such that the foregoing thermally conductive gas is to be liberated evenly into the discharge space 106 with the aid of an exceeding gaseous pressure in the foregoing circular space to the gaseous pressure in the discharge space 106.

In view of this, it is required for each of the upper and lower joint allowances 215-1 and 215-2 not to have any allowance portion of 0.5 mm or more in size. As for the condition to satisfy this requirement, each of the two related faces to be contacted so as to form such joint allowance is desired to have a surface roughness of $Rz \geq 1.6$ under the JIS.

On the basis of the results obtained through the following experimental studies by the present inventors, it has been confirmed that the foregoing MW-PCVD apparatus is sufficient to attain the object of the present invention.

(1) The present inventors have experimentally found that the reason why the conventional MW-PCVD film-forming process is difficult to stably provide a desirable deposited film satisfactory in characteristics is ascribed to a difficulty in properly controlling the substrate temperature during the film formation to form a deposited film at a high deposition rate.

As described before, in order to heighten the deposition rate in the MW-PCVD process, it is generally necessary to raise the flow rate of a film-forming raw material gas in addition to raising the discharging microwave power. At the same time, it is necessary to maintain the pressure in the discharge space at a high vacuum level of a few tens mTorr or less in order to prevent occurrence of undesirable gas phase reactions to provide desired characteristics for a deposited film to be obtained.

However, the discharge with a high discharging microwave power entails uneven substrate temperatures. On the other hand, at an inner pressure of several tens mTorr, thermal conductivity between the related bodies not completely contacted with each other lowers considerably.

Especially, where continuous conveyance and withdrawal of a plurality of substrates into the film-forming chamber is repeated as with the MW-PCVD apparatus for producing electrophotographic photosensitive drums, it is difficult to intimately contact these substrates with a temperature control means provided outside the substrates. In this respect, in the conventional MW-PCVD film-forming process, the transfer of heat to the substrate during the film formation is mainly made through radiation. However, cooling is different from the case of heating, i.e. a related body having a temperature of about 200° to 400° C. cannot be cooled through heat radiation within a short period of time, and thus satisfactory temperature control is not possible in the known MW-PCVD process.

In particular, where discharge by microwave is continued, for example, for an hour, substrate holders, circumferential walls of the film-forming chamber and the like other than the substrates are appreciably heated. This disenables the heat to transfer from the substrates to other parts with a pronounced increase of the substrate temperature. Hence to cool the substrates becomes more important.

In view of the above, the present inventors have made studies on the control of a substrate temperature in the MW-PCVD process for forming a deposited film of large area at a high deposition rate.

As a result, there have been found the following items: (i) in order to properly control the substrate temperature, it is desired for the substrate to be efficiently cooled during the formation of a deposited film on the substrate, and (ii) in order to provide desired characteristics for a deposited film to be formed, it is desired for the pressure in the discharge space to be maintained at a very low level.

For satisfying these conditions, the present inventors have made studies on whether or not the rise in gaseous pressure in the inside space of each of the cylindrical substrate holders having a cylindrical substrate thereon in such a way as not to give any negative influence for the discharge space is effective.

That is, in the foregoing MW-PCVD apparatus shown in FIGS. 1 and 2, when the gaseous pressure in the circular space of each of the cylindrical substrate holders having a cylindrical substrate 105 thereon was made higher than that in the discharge space 106 by passing a cooled hydrogen gas from the temperature controlling system (213 in FIG. 2) through the circular space of the cylindrical substrate holder and the upper and lower joint allowance (215-1, 215-2 in FIG. 2) into the discharge space 106 while cooling the cylindrical substrate 105 from its rear side, each of the cylindrical substrates 105 could be stably and evenly maintained at a desired temperature during the film formation and there could be stably formed a desirable deposited film on each of the cylindrical substrates.

In view of this, it has been confirmed that the MW-PCVD apparatus shown in FIGS. 1 and 2 are effective for stabilizing and unifying the temperature of a cylindrical substrate of large area upon forming a deposited film.

(2) The present inventors have experimentally found that the reason why a deposited film obtained by the known MW-PCVD film-forming process often becomes accompanied with defects is due to contamination of deposited film fine particles peeled off from the auxiliary substrates, microwave introducing window and waveguide. The present inventors have experimentally found the following facts also. That is, in the vicinity of the microwave introduction means in the discharge space, the energy density there is higher than those in other regions, along with this, the density of active species produced by the plasma is high. This leads to form deposited films larger on the surfaces of the substrate end portions, auxiliary substrates, waveguide and microwave introducing window in the vicinity of the microwave introducing means in the discharge space respectively three of four times larger in thickness than the thickness of a film deposited on the remaining surface portion of the substrate with some case where the adhesion is lower. And, since the energy density of microwave is high in such vicinity, a film deposited therein receives a local rise in temperature, leading to a greater tendency that the deposited film peels off. This tendency becomes more pronounced in the case where a deposited film is formed while rotating the cylindrical substrate. In the case of forming a sufficiently thick deposited film on a cylindrical substrate being rotated, the structural portions of the apparatus such as the microwave introducing means in particular are kept exposed to microwave plasma discharge for a long period of time without being moved, and because of this, there are deposited films on such portions in a several times thicker thickness in comparison with the thickness of the deposited film on the cylindrical substrate, and the exposure time becomes longer with an attendant serious problem that such thick deposited films peel off.

And fine particles of those removed deposited films split and drop over the entire surface of the cylindrical substrate and finally contaminate into the deposited film to be formed on the cylindrical substrate. This results in making the resulting deposited film to be accompanied with defects.

The present inventors have experimentally confirmed that these problems can be effectively eliminated and a desirable deposited film having a uniform thickness and having a wealth of many practically applicable characteristics without accompaniment of defects can be stably and repeatedly formed on a cylindrical substrate at a high deposition rate according to the MW-PCVD process for forming a deposited film of the present invention. The reason for bringing about this effect is considered as follows. That is, the foregoing thermally conductive gas, which is not contributing to the deposition of a film, is evenly dispersed into the discharge space 106 in addition to the substrate temperature controlling effect as described in the above (1).

Because of this, the density of active species capable of contributing to the formation of a deposited film generated in the vicinity of the microwave introducing means in the discharge space is reduced by dilution with the dispersed thermally conductive gas, which causes reduction in the thicknesses of films deposited on the surfaces of the substrate end portions, auxiliary substrates, waveguide and microwave introducing window. The deposition rates of such deposited films are accordingly reduced. Hence, the stresses on such deposited film become small to be adhesive. There is another factor in this respect that since the thermally conductive gas eventually stays in the foregoing circular space of the cylindrical substrate holder for certain period of time during which it is heated because of contacting with the heated circumferential wall of the said substrate holder and the heated rear face of the cylindrical substrate, the thermally conductive gas exhausted through the foregoing upper and lower joint allowances into the discharge space has almost the same temperature as the film-forming gas in the discharge space, and because of this, no difference results between the both end portions and the remaining portion of the cylindrical substrate.

The present inventors have confirmed that the MW-PCVD process according to the present invention which is practiced in the foregoing MW-PCVD apparatus is especially effective for the mass-production of electrophotographic photosensitive drums excelling in electrophotographic characteristics on industrial scale.

(3) The present inventors have experimentally found that the reason why the conventional MW-PCVD film-forming process is apt to provide a deposited film poor in uniformity of the thickness and also poor in uniformity of the characteristics is due to gas flows in upper and lower directions along the surface of a cylindrical substrate. In the conventional MW-PCVD film-forming process, film-forming raw material gases as introduced in the discharge space circumscribed by a plurality of cylindrical substrates are activated by plasma discharge to cause the formation of a deposited film on each of the plurality of cylindrical substrates, and the remaining gas not consumed in the formation of said deposited film is exhausted outside the discharge space. That is, the said remaining gas is mainly exhausted through spaces established between every two cylindrical substrate and part of which is exhausted through an upper space between the upper auxiliary substrate and the upper microwave introducing means and also through a lower space between the lower auxiliary substrate and the lower microwave introducing means. In this connection, there occur gas flows along the generating lines for each of the cylindrical substrates in the discharge space. Occurrence of such gas flows in plasma atmosphere causes differences in the types and amounts of molecules, radicals and ions at their upstream and downstream portions. This is due to the difference in time for the film-forming raw material gas to be exposed to plasma and the loss of specific active species capable of contributing to the film deposition. As a result, the resulting deposited film becomes ununiform in the characteristics, in more detail, it becomes such that has a difference in the characteristics between its central portion and its end portions.

The present inventors have experimentally confirmed that the above problems can be effectively eliminated according to the MW-PCVD process of the present invention, wherein the foregoing occurrence of undesirable gas flows, which is found in the known MW-PCVD process, can be effectively prevented by supplying a thermally conductive gas such as $H_2$ gas or He gas through both the upper and lower end potions of each of the cylindrical substrates in the discharge space.

The present inventors have also confirmed that the above effect of the present invention is further enhanced in the case where the MW-PCVD process of the present invention is practiced in the MW-PCVD apparatus shown in FIGS. 1 and 2 with which the bias electrode 109 is provided, wherein the MW-PCVD film-forming process is carried out while the bias electrode 109 being applied with a desired DC voltage to generate an electric field between it and a plurality of cylindrical substrates, whereby ion impacts of active species capable of contributing to the film deposition are effectively controlled.

Figure 5A:
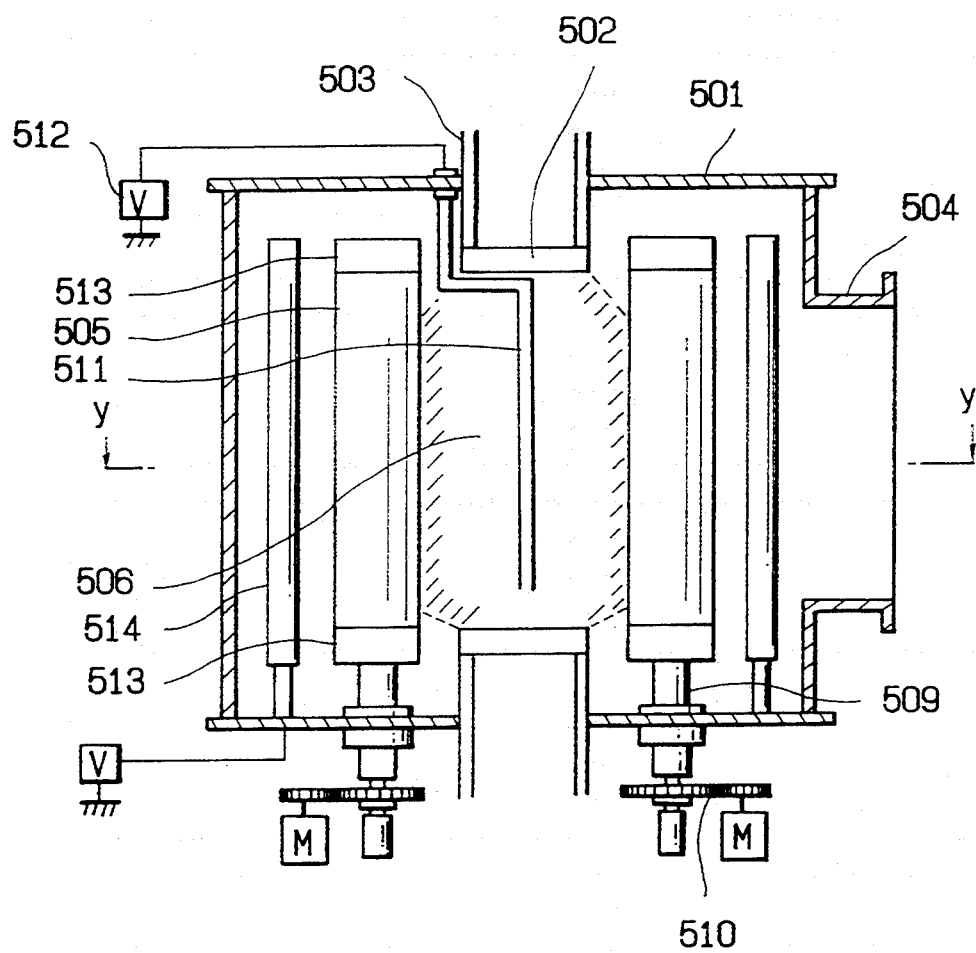
FIG. 5(A) is a schematic side view, in section, of a MW-PCVD apparatus for forming a deposited film which has an electrode.
Figure 5B:
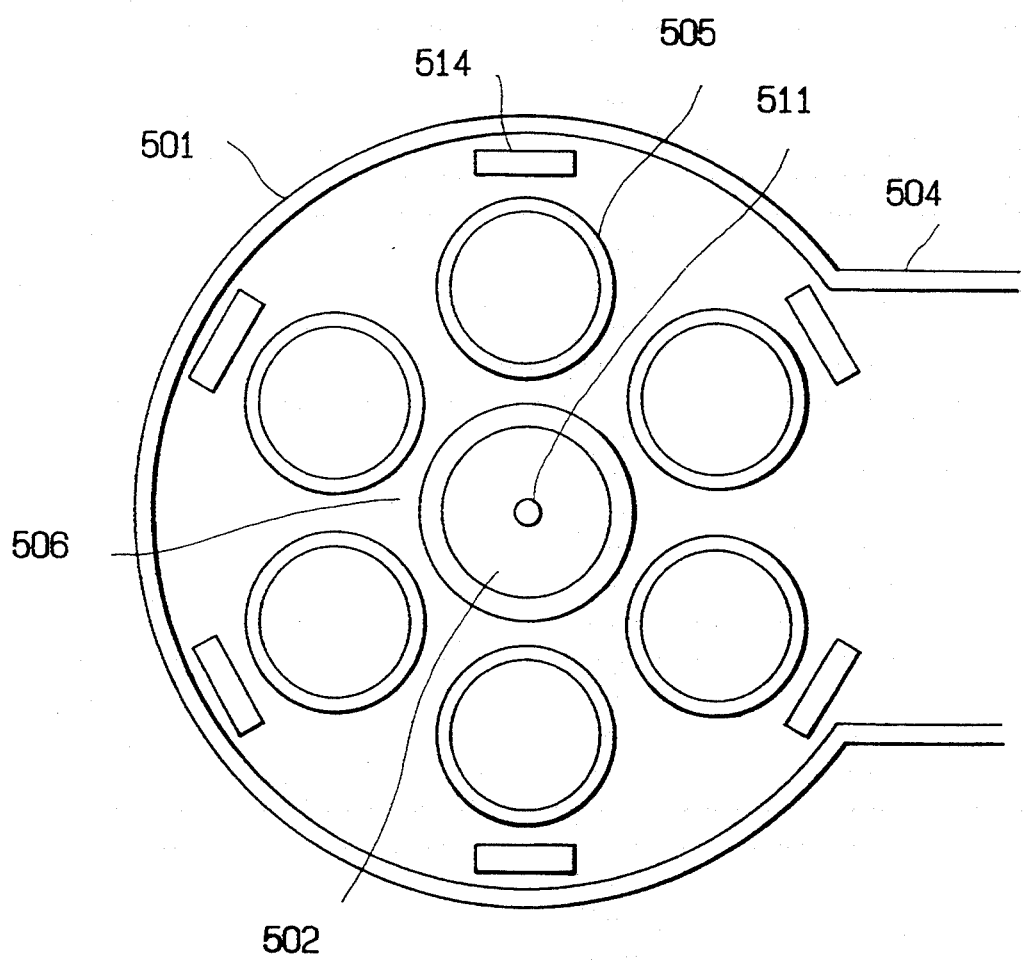
FIG. 5(B) is a schematic plan view, in section, taken along line Y—Y of the apparatus of FIG. 5(A).
Figure 6A:
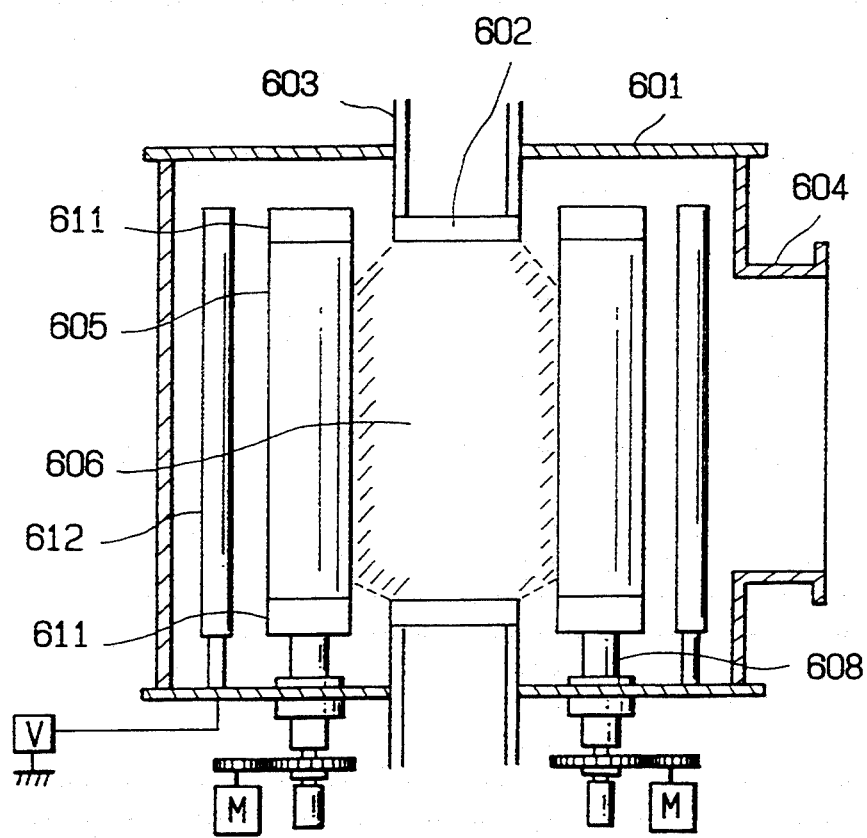
FIG. 6(A) is a schematic side view, in section, of a known MW-PCVD apparatus for forming a deposited film.
Figure 6B:
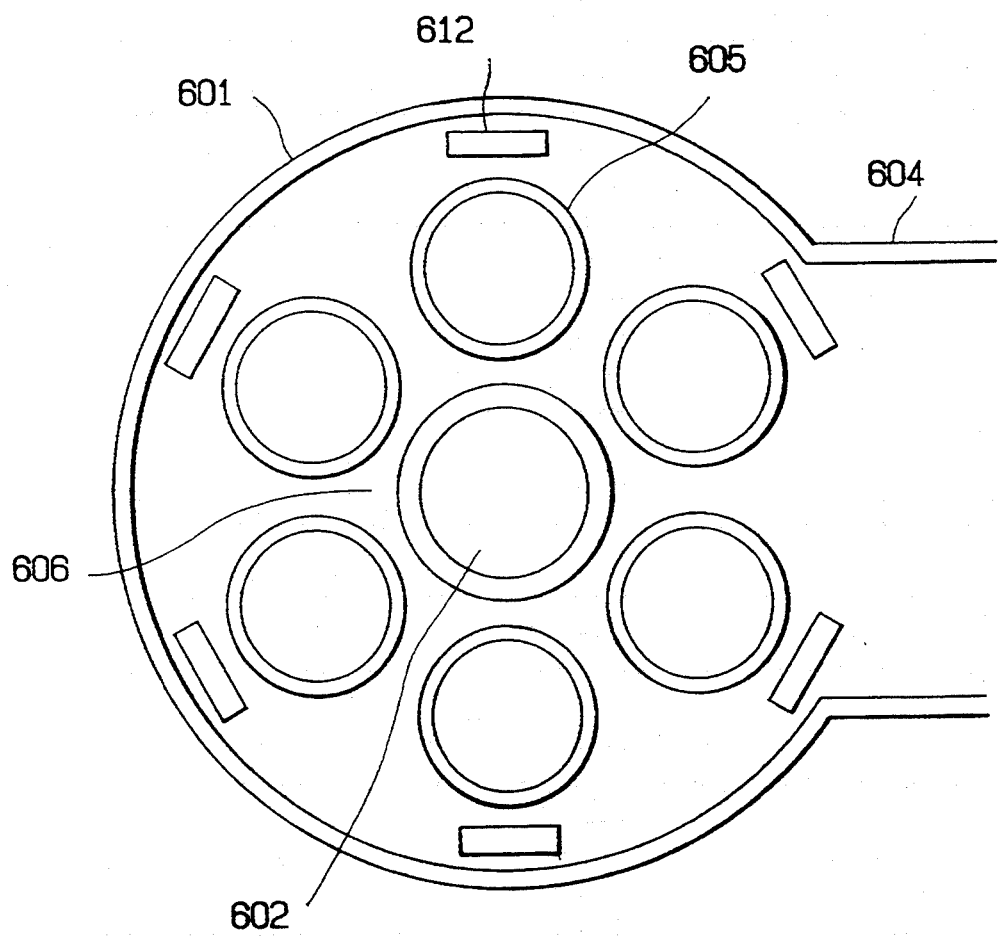
FIG. 6(B) is a schematic plan view, in section, taken along line Y—Y of the apparatus of FIG. 6(A).

As described before, even in the case of the MW-PCVD process using the MW-PCVD apparatus shown in FIGS. 5(A) and 5(B) which comprises provision of an bias electrode 511 in the conventional MW-PCVD apparatus shown in FIGS. 6(A) and 6(B), there are still problems that the energy caused as a result of ion impacts after acceleration of the ions with an electric field contributes to heat each of the cylindrical substrates, and as a result, each of the cylindrical substrates eventually becomes very high in temperature as the discharge time is prolonged, whereby a resulting deposited film becomes ununiform in the characteristics. There are further problems in this case. That is, the microwave introducing means is provided near the end portion of the cylindrical substrate in the apparatus in which this process is to be practiced and because of this, the ion density in the vicinity of the microwave introducing means is inevitably increased. This causes ununiformity in the ion impacts on the surfaces between the region in the vicinity of the microwave introducing means and the other region, causing the characteristics of the resulting deposited film to be ununiform. The ununiformity of the ion impacts becomes more pronounced with increasing microwave discharging power.

The present inventors have experimentally confirmed that according to the MW-PCVD film-forming process of the present invention, the above problems can be effectively eliminated by supplying a thermally conductive gas such as $H_2$ gas or He gas through both the upper and lower end portions of each of the cylindrical substrates to thereby desirably lessen those ion impacts, and utilizing the advantages with the use of a bias electrode, a desirable deposited film of large area having a uniform thickness and excelling in the uniform characteristics can be stably formed at a high deposition rate.

The MW-PCVD process for forming a functional deposited film according to the present invention using the MW-PCVD apparatus having the bias electrode 109 shown in FIGS. 1 and 2 is carried out, for example, in the following way.

Firstly, the film-forming chamber 101 is evacuated through the exhaust pipe 104 by means of an exhaust device (not shown) to a desired vacuum degree. Then, the cylindrical substrates 105 are heated to and maintained at a predetermined temperature by actuating the external heater 112 while the cylindrical substrates 105 being rotating.

Thereafter, one or more film-forming raw material gases such as $SiH_4$, $B_2H_6$, etc. are supplied at predetermined respective flow rates through the gas feed pipes 104 into the discharge space 106 of the film-forming chamber 101. Then the inner pressure of the discharge space is adjusted to a value of $1 \times 10^2$ Torr or less by regulating an exhaust valve (not shown). After the flow rates of the film-forming raw material gases become stable, and the DC power source (110) is switched on to apply a predetermined voltage of DC to the bias electrode 109. Concurrently, a microwave of 2.45 GHz generated from a microwave power source (not shown) is applied into the discharge space 106 through an impedance matching box (not shown), the waveguide 103 and the microwave introducing 102. Upon introduction of said microwave into the discharge space 106, the external heater 112 is switched off in order to prevent the temperature of each of the cylindrical substrates 105 from excessively rising because of the action of the microwave energy. At the same time a cooling liquid medium such as cooled water is introduced through the cylindrical conduit (213' in FIG. 2) into and recycled through the temperature controlling system (113 in FIG. 1 or 213 in FIG. 2), and concurrently a thermally conductive gas such as $H_2$ gas or He gas is introduced through the second circular conduit (213''' in FIG. 2) into the temperature controlling system (113 in FIG. 1 or 213 in FIG. 2) and passed through the circular space of the cylindrical substrate holder and the upper and lower joint allowances (215-1, 215-2 in FIG. 2) into the discharge space 106, whereby the entire temperature of each of the cylindrical substrates 105 is controlled to a desired degree.

In the MW-PCVD process according to the present invention thus practiced, the film-forming raw material gases are effectively excited and decomposed to thereby produce neutral radicals, ions, electron, etc. and they are reacted with each other to cause the formation of a desirable deposited film on the temperature-controlled cylindrical substrate at a high deposition rate without contamination of removed particles of deposited films which is found on the known MW-PCVD process.

The thermally conductive gas used in the present invention may be any gas as long as it does not give any negative influence for the film to be formed when introduced into the discharge space. Examples of such gas include hydrogen gas, various inert-gases and mixtures thereof. In view of good thermal conductivity and small ion impact when ionized, hydrogen gas and helium gas are most preferred.

In the MW-PCVD process for forming a functional deposited film of the present invention, the interrelation between the gaseous pressure in the inside space of the cylindrical substrate holder and the gaseous pressure in the discharge space is an important factor.

Among the principal effects of the present invention, the cooling effect of the substrate starts to appear when the gaseous pressure in the inside space of the substrate holder is about 100 mTorr higher than that in the discharge space, and it becomes more pronounced at a gaseous pressure higher than the above level.

In addition to the above effect, the present invention brings about a significant effect of preventing the films deposited on unmoved structural parts of the film-forming chamber other than the cylindrical substrate such as the waveguide, microwave introducing window, etc. from peeling off. This effect is realized by exhausting the thermally conductive gas through the upper and lower end portions of the cylindrical substrate into the discharge space situated in the vicinity of the microwave introducing means. In this connection, the pressure of the thermally conductive gas to be exhausted through the upper and lower end portions of the cylindrical substrate is necessary to be of a prescribed level. For this purpose, as well as in the above case, the gaseous pressure in the inside space of the cylindrical substrate holder is necessary to be at least about 100 mTorr higher than that in the discharge space.

However, when the gaseous pressure in the inside space of the cylindrical substrate holder is excessively higher than that in the discharge space, the exhausting gas pressure becomes abnormally high to make the flow of the thermally conductive gas uneven in the discharge space, thus causing scatter of the films deposited on the end portions of the cylindrical substrates.

As a result of experimental studies by the present inventors on the upper limit for the difference between the gaseous pressure in the inside space of the cylindrical substrate holder and that in the discharge space, it has been found that said upper limit at which no troubles are caused is 100 Torr or less. It has been also found that the difference between the gaseous pressure in the inside space of the cylindrical holder and that in the discharge space is preferably in the range of from 200 mTorr to 90 Torr, and more preferably in the range of from 300 mTorr to 80 Torr.

As for the gaseous pressure in the discharge space, it may be of any level as long as plasma discharge effectively takes place. However, it is preferably less that 100 mTorr, and more preferably less than 50 mTorr.

As for the upper and lower joint allowances through each of which the thermally conductive gas is exhausted, other than what has been above described, the related two end portions to be contacted may be shaped so as to leave an allowance capable of providing a desired conductance when they are contacted. In other alternative, it is possible to make a plurality of fine holes through which the thermally conductive gas can be effectively exhausted for the auxiliary substrates, where the contacted portions are completely sealed.

In the present invention, there can be used other temperature controlling means (or temperature controlling system) than the foregoing temperature controlling system detailed in FIG. 2. As such temperature controlling means, there can be illustrated a cooling coil, as cooling plate or a cooling cylinder capable of passing a cooling medium such as a liquid or a gas there through, which is provided in the inside of the substrate.

The surface materials for the cooling means (or temperature controlling system) in any case may be metals such as stainless steels, nickel, aluminum, copper and the like, ceramics, polymer resins and the like.

As the external heater for pre-heating the cylindrical substrate prior to introduction of microwave into the discharge space, any conventional heater for use in vacuum deposition may be used. Examples of such a heater include electric heaters such as sheathed wire-wrap heater, plate heaters such as halogen lamps, infrared lamps and the like, and heaters using a liquid or gas as a heating medium for heat exchange. The surface materials for the heating means include, for example, metal such as stainless steels, aluminum, copper and the like, ceramics and heat-resistant polymer resin, and the like. Aside, a heating-only container other than the reaction container may be provided. After heating the substrates may be transferred into the reaction container in vacuum.

The raw material gases for the formation of a deposited film according the the invention include, for example gases used to form amorphous silicon such as silane ($SiH_4$), disilane ($Si_2H_6$) and the like, gases used to form functional deposited films such as germane ($GeH_4$) methane ($CH_4$) and the like, and mixtures thereof. Hydrogen ($H_2$), argon (Ar) and helium (He) are mentioned as a diluent gas.

Gases which are useful in improving characteristics such as by varying the band gap of deposited film may be used including, for example, nitrogen ($N_2$), nitrogen-containing compounds such as ammonia ($NH_3$), oxygen ($O_2$), oxygen-containing compounds such as nitrogen monoxide (NO), dinitrogen oxide ($N_2O$) and the like, hydrocarbons such as methane ($CH_4$), ethane ($C_2H_6$), ethylene ($C_2H_4$), acetylene ($C_2H_2$), propane ($C_3H_8$) and the like, fluorine compounds such as silicon tetrafluoride ($CF_4$), disilicon hexafluoride ($Si_2F_6$) and the like, and mixtures thereof.

Dopant gases such as diborane ($B_2H_6$), boron trifluoride ($BF_3$), phosphine ($PH_3$) and the like may also be introduced into the discharge space.

The substrate materials ordinarily used in the present invention include, for example, metals such as stainless steels, Al, Cr, Mo, Au, In, Nb, Te, V, Ti, Pt, Pd, Fe and the like, alloys of these metals, synthetic resins such as polycarbonate, glass, ceramics, paper and the like.

The substrate temperature employed at the time of forming a deposited film may be of any temperature. But it is generally in the range of from 20° C. to 500° C., preferably from 50° C. to 450° C., within which good results are obtained.

The passage of the microwave before the reaction chamber may be effected by the use of waveguides and the passage into the reaction chamber may be effected by the use of one or plural dielectric windows.

The materials for the window through which the microwave is introduced into the chamber should be those which have a reduced loss of the microwave and include, for example, alumina ($Al_2O_3$), aluminum nitride (AlN), boron nitride (BN), silicon nitride (SiN), silicon carbide (SiC), silicon oxide ($SiO_2$), berylium oxide (BeO), teflon, polystyrene and the like.

The electric field generated between the bias electrode and the cylindrical substrates should preferably be a DC electric field. The direction of the electric field should be preferably from the electrode toward the substrate.

The average DC voltage which is applied to the bias electrode for the generation of electric field is preferably in the range of from 15 V to 300 V, and more preferably in the range of from 30 V to 200 V.

The waveform of the DC voltage is not critical in the practice of the invention. Any waveform may be employed provided that the direction of voltage does not change depending on the time. For example, there may be used a constant voltage which does not vary in magnitude in relation to the time, a pulsating voltage, or a ripple voltage which is rectified through a rectifier and varies in magnitude depending on the time.

Alternatively, an AC voltage may be used in the practice of the invention. Any frequency may be used. In practical applications, low frequencies of 50 Hz and 60 Hz and a high frequency of 13.56 MHz are suitably used. The AC waveform may be a sine wave or a rectangular wave or other waves. In practice, the sine wave is appropriate. The voltage means an effective value in any case.

The size and shape of the bias electrode are not critical unless the discharge is disturbed. In practice, the electrode should preferably have a cylindrical form with a diameter of from 1 mm to 5 cm. The length of the electrode is also not critical provided that a uniform electric field is applicable to substrate.

The materials for the electrode may be one whose surface is electrically conductive and include, for example, metals such as stainless steels, Al, Cr, Mo, Au, In, Nb, Mi, Cu, Ag, Te, V, T, Pt, Pd, Fe, Zn and the like or alloys thereof, and glass, ceramics and plastic resins whose surface is treated for rendering them conductive.

The MW-PCVD process according to the present invention is effectively applicable in the preparation of photosensitive members for electrophotographic copying machines or printers such as blocking type amorphous silicon system photosensitive members or high resistance amorphous silicon system photosensitive members and also for the preparations of other devices requiring to have a functional deposited film as the constituent element capable of providing good electric characteristics.

Moreover, the MW-PCVD process of the present invention may be carried out in any known MW-PCVD apparatus, and it can be effectively realized in such MW-PCVD apparatus wherein a plurality of substrates are provided to circumscribe a discharge space and microwave is introduced through a waveguide at least from one end of the apparatus into the discharge space.

DESCRIPTION OF THE PREFERRED EMBODIMENTS

The invention will be described more specifically while referring to Experiments and Examples but the invention is not intended to limit the scope only to them.

Experiment 1 and Comparative Experiment

In Experiment 1, using the MW-PCVD film-forming apparatus according to the present invention shown in FIGS. 1 to 2, there were prepared six electrophotographic photosensitive drums respectively having an amorphous silicon light receiving layer comprised of a charge injection inhibition layer a photoconductive layer and a surface layer, being stacked in-this order on a cylindrical aluminum substrate of 5 mm in thickness, 358 mm in length and 108 mm in outer diameter under the film-forming conditions shown in Table 1.

Likewise, in Comparative Experiment, there were prepared six electrophotographic photosensitive drums using the conventional MW-PCVD film-forming apparatus shown in FIG. 6, under the same fabrication conditions as in Experiment 1.

In Experiment 1, the external heater 214 was switched off upon rise in the temperature of the cylindrical substrate by application of microwave energy whereupon water was passed through the temperature controlling system 213 to maintain the temperature of the outer wall of the second circular conduit 213''' at 20° C. At the same time, hydrogen gas was introduced into the temperature controlling system 213 so that the inner pressure in the inside space of the substrate was kept at 1 Torr. This hydrogen gas was passed through the joint allowances 215-1 and 215-2 into the spaces in the vicinity of the microwave introducing means. The flow rate of the hydrogen gas was made 20% based on the flow rate of the film-forming raw material gas. That is, since microwave was supplied from the upper and lower sides of the cylindrical substrate 105, the flow rate of the hydrogen gas discharged from the two ends of the cylindrical substrate 105 was set, during the formation of the light receiving layer, at 140 sccm for each side and at a total of 280 sccm per 700 sccm of the film-forming raw material gas, wherein since six cylindrical substrates were used, the flow rate was made about 47 sccm per substrate.

In the Comparative Experiment, the external heater 514 was switched off, as in Experiment 1, upon rise in the temperature of the cylindrical substrate by application of microwave energy. The pressure in the inside space of the substrate was kept at the same level as that in the discharge space 606.

The substrate temperature during the formation of the light receiving layer was measured by contact of a thermocouple with the respective substrate surfaces in Experiment 1 and Comparative Experiment. In the comparative experiment, the substrate temperature was gradually increased simultaneous with commencement of the discharge irrespective of the fact the external heater was switched off.

On the other hand, the substrate temperature was varied in Experimental Example 1 but was kept in a certain temperature range from commencement to completion of the discharge. The difference between the maximum and minimum substrate temperatures during the formation of the light receiving layer was 20% in Experiment 1 when the value in Comparative Experiment was taken as 100%.

EXPERIMENT 2

The procedures of Experiment 1 were repeated except the joint allowances 215-1, 215-2 were so adjusted as to vary the pressure of hydrogen gas in the inside space of each cylindrical substrate, thereby preparing six electrophotographic photosensitive drums. During their preparation, the difference between the maximum and minimum temperatures of the cylindrical substrates (i.e. substrate temperature control range) was measured. The results were as shown in FIG. 3.

In FIG. 3, the abscissa axis represents the pressure difference between the inside and the outside of the cylindrical substrate, and the ordinate axis represents the difference between the maximum and minimum substrate temperatures during the formation of the light receiving layer. The value of 100% indicates the difference between the maximum and minimum substrate temperatures during the formation of the light receiving layer in the foregoing comparative experiment. As the results of FIG. 3 illustrate, it is understood that the pressure difference between the inside and the outside of the cylindrical substrate is to be 100 mTorr or more in order to provide desired cooling capability, within which the control of the substrate temperature can be satisfactorily carried out.

EXPERIMENT 3

The procedures of Experiment 2 were repeated, wherein a glass fiber was inserted from a feed through (not shown) into the film-forming chamber (101), and was connected to a spectrophotometer, followed by measurement of a luminous intensity during the discharge while varying the pressure of hydrogen gas in the inside space of the cylindrical substrate. The results were as shown in FIG. 4. In the figure, the abscissa axis indicates the pressure difference between the inside and the outside of cylindrical substrate and the ordinate axis indicates a value obtained by dividing the widths of the maximum and minimum luminous intensities by their average value, i.e. a dispersion of the liminous intensity. As the results of FIG. 4 illustrate, it is understood that when the pressure difference between the inside and the outside of substrate exceeds 100 Torr, the dispersion of the luminous intensity abruptly becomes great, causing unstable discharge.

EXAMPLE 1

The procedures of Experiment 1 were repeated, except that the flow rate of hydrogen gas being passed into the inside space of the cylindrical substrate was changed as shown in the column "Flow Rate of Hydrogen" of Table 2 and that the joint allowances 215-1, 215-2 were adjusted so that the pressure of the hydrogen gas in the inside space of each cylindrical substrate became 1 Torr, to thereby prepare six electrophotographic photosensitive drums.

The drums thus prepared were each set in Canon's Electrophotographic Copying Machine NP 7550 (commercial name), and the surface potential characteristic and the image quality of a copied image were evaluated. The evaluated results were shown in Table 2 in which were also shown the evaluated results for the electrophotographic photosensitive drums obtained in Comparative Experiment. As for the evaluation item of image quality, there were obtained a plurality of copied images for each of the resultant electrophotographic photosensitive drums and the resultant copied images were totally evaluated.

EXAMPLE 2

The procedures of Example 1 were repeated, except that the cooling gas, $H_2$, in Table 1 was replaced by F-containing gases such as $SiF_4$ and $Si_2F_6$, Ar or He, to thereby prepare a plurality of electrophotographic photosensitive drums. These drums were evaluated in the same manner as in Example 1 and there were obtained satisfactorily good results in any of the cases irrespective of the kind of a gas used.

EXAMPLE 3

The procedures of Examples 1 and 2 were repeated, except that part of the film-forming raw material gas, i.e. $SiH_4$, was replaced by $GeH_4$, to thereby prepare a plurality of electrophotographic photosensitive drums. These drums obtained were evaluated with good results similar to those of Examples 1 and 2, revealing the improvement in the characteristics.

EXAMPLE 4

The procedures of Examples 1 to 3 were repeated, except that the cooling gas was changed from $H_2$ to He, to thereby prepare a plurality of electrophotographic photosensitive drums. These drums obtained were evaluated with good results similar to those of Examples 1-3, revealing the improvement in the characteristics.

TABLE 1

| Layer-forming conditions | Charging Injection Inhibition Layer | Photo-conductive Layer | Surface Layer |
| --- | --- | --- | --- |
| gas used and its flow rate | | | |
| $SiH_4$ | 500 sccm | 500 sccm | 100 sccm |
| $H_2$ | 200 sccm | 200 sccm | 200 sccm |
| $B_2H_6$ | 1000 ppm | — | — |
| $CH_4$ | — | — | 500 sccm |
| Gaseous pressure in the discharge space | 3.0 mTorr | 3.0 mTorr | 3.0 mTorr |
| Gaseous pressure in the inside space of the substrate holder | 1.0 Torr | 1.0 Torr | 1.0 Torr |
| Microwave power | 1400 W | 1400 W | 1400 W |
| Applied DC voltage | 100 V | 100 V | 100 V |
| Applied DC current | 10 A | 10 A | 10 A |
| Surface temperature of each substrate | 270~300 °C. | 300~320 °C. | 300~320 °C. |

TABLE 2

| flow rate of $H_2$ gas (*) | apperance of defective images | charge retentivity () | sensitivity () | potential irregularity (**) | total evaluation |
| --- | --- | --- | --- | --- | --- |
| Comparative Example (comparative experiment 1) | | | | | |
| 0 | ○ | 1 (control) | 1 (control) | 1 (control) | poor |
| Example 1 | | | | | |
| 0.5% | ○ | 1.19 | 1.08 | 1 | good |
| 1% | ⊙ | 1.21 | 1.09 | 0.92 | excellent |
| 5% | ⊙ | 1.20 | 1.11 | 0.50 | excellent |
| 20% | ⊙ | 1.20 | 1.10 | 0.40 | excellent |
| 100% | ⊙ | 1.22 | 1.09 | 0.52 | excellent |
| 500% | ⊙ | 1.19 | 1.10 | 0.90 | excellent |
| 700% | ○ | 1.20 | 1.09 | 1.10 | good |

(*): The ratio of the flow rate of hydrogen gas (thermally conductive gas) versus the flow rate of film-forming raw material gases in total.
(**): a relative value on average versus the value on average in Comparative Example wherein it was made 1 as the control.
⊙: all the resultant photosensitive drums are excellently free of defective images.
○: some of the resultant photosensitive drums are accompanied with practically negligible defective images.
△: some of the resultant photosensitive drums are not practically usable.
X: all the resultant photosensitive drums are not practically usable.

What is claimed is:

1. A microwave plasma chemical vapor deposition process for the formation of a functional deposited film on a plurality of cylindrical substrates each having auxiliary substrates by means of a microwave plasma chemical vapor deposition to be conducted in a substantially enclosed film-forming chamber, said film-forming chamber comprising a circumferential wall having an end portion thereof hermetically provided with a microwave introducing window to which a waveguide extending from a microwave power source is connected, said film-forming chamber having a discharge space and a plurality of rotatable cylindrical substrate holders therein, each of said substrate holders being capable of having one of said cylindrical substrates positioned thereon, said substrate holders being concentrically arranged in said film-forming chamber so as to circumscribe said discharge space, said film forming chamber being provided with means for supplying a film-forming raw material gas into said discharge space and means for evacuating said film-forming chamber, wherein a functional deposited film is formed on each of said cylindrical substrates by microwave glow discharge in film-forming raw material gas to generate plasma causing the formation of said functional deposited film on each of said cylindrical substrates while rotating said cylindrical substrate, the improvement which comprises maintaining each of the cylindrical substrates at a desired temperature by using a thermally conductive gas, wherein said thermally conductive gas is cooled with a cooling liquid medium, and is directed toward the inner circumferential wall of said substrate holder having said substrate positioned thereon in the interior space of said substrate holder, passing the cooled thermally conductive gas through (a) a joint allowance between the upper auxiliary substrate and the cylindrical substrate holder and (b) a joint allowance between the lower auxiliary substrate and the cylindrical substrate holder into the film-forming chamber.

2. The process according to claim 1, wherein the difference in pressure between the inside of each substrate and the discharge space is adjusted to be in the range from 100 mTorr to 100 Torr.

3. An apparatus for the formation of a functional deposited film on a plurality of cylindrical substrates each having an upper and lower auxiliary substrate by means of microwave plasma chemical vapor deposition, said apparatus having a substantially enclosed film-forming chamber with a center longitudinal axis and comprising a circumferential wall having an end portion thereof provided with a microwave introducing window to which a waveguide extending from a power source is connected, said film-forming chamber having a plasma generation space and a plurality of rotatable cylindrical substrate holders therein, each of said substrate holders capable of having one of said cylindrical substrates positioned thereon, said rotatable cylindrical substrate holders being concentrically arranged in said film-forming chamber substantially parallel and equidistant from said center longitudinal axis of said deposition chamber, said film-forming chamber being provided with means for supplying a film-forming raw material gas into said plasma generation space and means for evacuating said film-forming chamber, the improvement, which comprises a temperature controlling system in the inside of each of said cylindrical substrate holders, said temperature controlling system having a passage for a thermally conductive gas which serves to cool the cylindrical substrate from its rear side, said temperature controlling system having means for supplying said thermally conductive gas to form a gas flow directed toward the inner circumferential wall of said substrate holder having said substrate positioned thereon in said passage, wherein said temperature controlling system being provided with a conduit which serves to supply a cooling medium for cooling said thermally conductive gas by way of heat exchange with said cooling medium.

* * * * *

UNITED STATES PATENT AND TRADEMARK OFFICE
CERTIFICATE OF CORRECTION

PATENT NO. : 5,439,715
DATED : August 8, 1995
INVENTOR(S) : RYUJI OKAMURA ET AL.

Page 1 of 2

It is certified that error appears in the above-identified patent and that said Letters Patent is hereby corrected as shown below:

COLUMN 2

Line 55, "500 MHZ," should read --500 MHz,--.

COLUMN 4

Line 5, "caused" should read --is caused--.

COLUMN 7

Line 3, "-to" should read --to--.
Line 35, "different" should read --difference--.

COLUMN 12

Line 60, "substrate" should read --substrates--.

COLUMN 13

Line 35, "an" should read --a--.

COLUMN 14

Line 10, "being rotating." should read --are rotated.--.
Line 19, "and" should be deleted.

UNITED STATES PATENT AND TRADEMARK OFFICE
CERTIFICATE OF CORRECTION

PATENT NO. : 5,439,715
DATED : August 8, 1995
INVENTOR(S) : RYUJI OKAMURA ET AL.

Page 2 of 2

It is certified that error appears in the above-identified patent and that said Letters Patent is hereby corrected as shown below:

<u>COLUMN 17</u>

Line 56, "in-this" should read --in this--.

<u>COLUMN 20</u>

Table 2, "apperance" should read --appearance--.

Signed and Sealed this

Twentieth Day of August, 1996

Attest:

BRUCE LEHMAN

Attesting Officer

Commissioner of Patents and Trademarks